(12) United States Patent
Keshavarzi et al.

(10) Patent No.: US 8,004,043 B2
(45) Date of Patent: Aug. 23, 2011

(54) LOGIC CIRCUITS USING CARBON NANOTUBE TRANSISTORS

(75) Inventors: Ali Keshavarzi, Portland, OR (US); Juanita Kurtlin, Hillsboro, OR (US); Vivek De, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 167 days.

(21) Appl. No.: 11/613,134

(22) Filed: Dec. 19, 2006

(65) Prior Publication Data

US 2008/0143389 A1 Jun. 19, 2008

(51) Int. Cl.
*H01L 51/05* (2006.01)

(52) U.S. Cl. ......... 257/369; 257/E51.005; 257/E51.04; 977/742; 977/938

(58) Field of Classification Search ............ 257/369, 257/E51.005, E51.04; 977/742, 938
See application file for complete search history.

(56) References Cited

U.S. PATENT DOCUMENTS

| | | | |
|---|---|---|---|
| 5,949,090 A | 9/1999 | Iwasa et al. | |
| 6,891,356 B2* | 5/2005 | Kimura et al. | 323/303 |
| 6,972,467 B2 | 12/2005 | Zhang et al. | |
| 7,492,015 B2* | 2/2009 | Chen et al. | 257/369 |
| 2005/0074926 A1 | 4/2005 | Bertin et al. | |
| 2006/0183278 A1* | 8/2006 | Bertin et al. | 438/197 |

FOREIGN PATENT DOCUMENTS

| KR | 10-2005-0059414 A | 6/2005 |
|---|---|---|
| WO | 2008/076529 A1 | 6/2008 |

OTHER PUBLICATIONS

International Search Report for corresponding matter P24297PCT dated Feb. 15, 2008.
Inernational Preliminary Report on Patentability received for PCT Patent Application No. PCT/US2007/082965, mailed on Jul. 2, 2009, pp. 6.
International Search Report dated Feb. 15, 2007 for PCT application PCT/US2007/082965, 10 pages.
Ali Keshavarzi, "Digital Circuits using Carbon Nanotubes: Modeling, Design and Architectures", 2006 ISSCC Forum: Circuit Design in Emerging Technologies, Feb. 5, 2006, pp. 1-56.
Robert Chau et al., "Advanced CMOS Transistors in the Nanotechnology Era for High-Performance, Low-Power Logic Applications", Components Research, Logic Technology Development, Intel Corporation, pp. 1-5.
Phaedon Avouris et al., "Electronics and Optoelectronics with Carbon Nanotubes", The Industrial Physicist, Jun./Jul. 2004, pp. 18-21.
Ali Javey et al., "Advancements in Complementary Carbon Nanotube Field-Effecr Transistors", 0-7803-7873-3/03 (c) 2003, pp. 1-4.
Jing Guo et al., "Towards Multi-Scale modeling of Carbon Nanotube Transistors", Dec. 1, 2003, pp. 1-41.
Jing Guo, "Carbon Nanotube Electronics: Modeling, Physics and Applications", Aug. 2004, 131 pages.
Hur et al.,"Printed thin-film transistors and complementary logic gates that use polymer-coated single-walled carbon nanotube networks," Journal of Applied Physics, 98, 2005, pp. 114302-1 to 114302-6.

* cited by examiner

*Primary Examiner* — Benjamin P Sandvik
*Assistant Examiner* — W. Wendy Kuo
(74) *Attorney, Agent, or Firm* — Erik R. Nordstrom

(57) ABSTRACT

In accordance with some embodiments, logical circuits comprising carbon nanotube field effect transistors are disclosed herein.

15 Claims, 3 Drawing Sheets

US 8,004,043 B2

LOGIC CIRCUITS USING CARBON NANOTUBE TRANSISTORS

BACKGROUND

The present invention relates generally to carbon nanotube field effect transistors (CNTFETs) and their associated integrated circuits.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

A CNTFET (carbon nanotube field effect transistor) is akin to a silicon MOSFET (metal oxide semiconductor field effect transistor) but with one or more carbon nanotubes in place of the silicon channel. CNTs may be well-suited for complementary logic traditionally implemented using CMOS circuits, among other things, because of their relatively high conduction mobility, for both holes and electrons.

Figure 1:
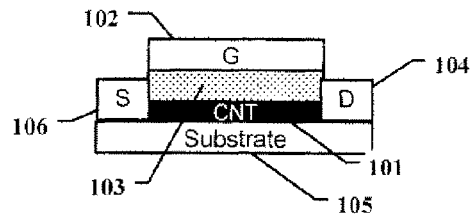
FIG. 1 is a cross-sectional diagram of a CNTFET in accordance with some embodiments.

FIG. 1 shows a cross-sectional view of a carbon nanotube field effect transistor (CNTFET) in accordance with some embodiments. The depicted CNTFET has a carbon nanotube (CNT) 101, functioning as a channel, with a gate insulator 103 sandwiched between the CNT and a gate electrode 102. It also has a drain 104 and source 106 (which are interchangeable, typically with no distinction between which can be a source and which can be a drain) mounted at opposite ends. It is mounted atop a substrate 105, which typically has an oxide insulator on top of it. It should be appreciated that these components may be implemented with any suitable materials in a variety of different configurations. However, in the following sections, some specific examples will be given for illustrative purposes.

As compared with MOSFET silicon channels, nanotubes have minimal (if any) dangling surface bonds. Accordingly, silicon dioxide ($SiO_2$) as a gate insulator, while suitable, is not required. Other crystalline or amorphous insulators (e.g., $HfO_2$, $ZrO_2$, or other materials including non-oxide insulators) with higher dielectric constants could be used instead. This can allow for higher performance in CNTFETs without having to use ultra-thin $SiO_2$ gate insulating films.

In some embodiments, a top gated structure with a Hafnium Oxide ($HfO_2$) gate insulator having a thickness of 2 nm may be used. A self-aligned geometry may also be implemented to reduce parasitic and/or fringe capacitance. On the other hand, sufficient gate capacitance is typically needed. Gate capacitance increases with increased gate electrode width. In some embodiments, it may be desired to have a gate electrode with a width of about 3 times the thickness of the gate insulator for sufficient gate capacitance.

The electrodes for the drain 104 and source 106 may be implemented with any suitable material. However, as discussed further below, selecting materials with a desired work function to position their Fermi energy levels appropriately for relative hole/electron conduction strengths (e.g., for complementary devices and circuits like CMOS and for a multi-stack configuration) may be sought. for example, in some embodiments, it may be desirable to use a metal such as Palladium (Pd) for source/drain with Fermi band levels generally leaning toward typical CNT valence bands for better hole conduction. (This is addressed again below.) With regard to dimensions, drain and source terminal widths should be chosen for making the transistor footprint very small while minimizing the parasitic resistance and capacitance relative to their lengths for desired performance. In an exemplary CNTFET, the drain and source electrodes have dimensions of 15 nm by 15 nm for a transistor channel (CNT) length of 50 nm.

Figure 2C:
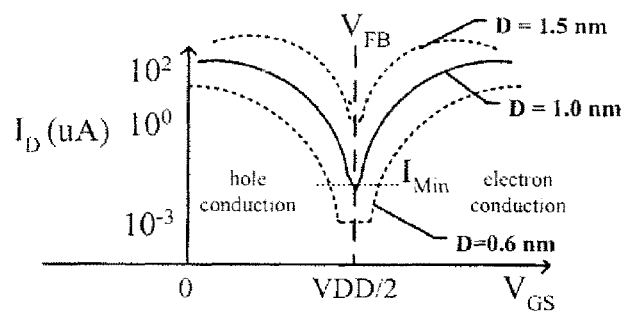
FIG. 2C is a diagram showing the conduction characteristics of a Schottky Barrier CNTFET in accordance with some embodiments.
Figure 2A:
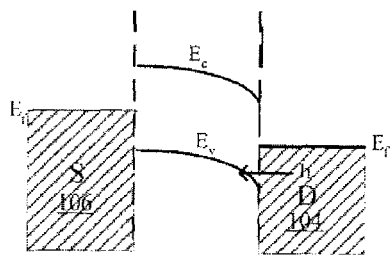
FIG. 2A is an energy band diagram showing hole conduction for a mid-gap Schottky Barrier CNTFET in accordance with some embodiments.
Figure 2B:
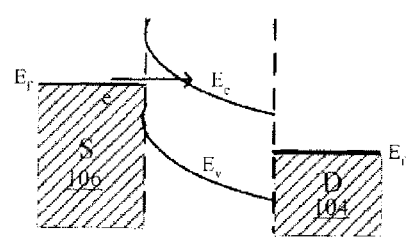
FIG. 2B is an energy band diagram showing, electron conduction for a mid-gap Schottky Barrier CNTFET in accordance with some embodiments.

With reference to FIGS. 2A-2C, electrical characteristics for an exemplary CNT channel are shown. Because the CNT channels are implemented with mid-gap SB carbon nanotubes, they are ambipolar, i.e., depending on how they are biased, they can conduct both holes and electrons. FIGS. 2A and 2B show conduction ($E_C$) and valence ($E_V$) band levels, relative to the drain and source Fermi levels ($E_F$) for hole conduction and electron conduction, respectively. As the gate is biased toward "negative" voltages (less than half of supply voltage and applied drain bias to the transistor), the energy bands are bent and shifted (relative to the drain/source Fermi levels) enabling holes to conduct through by tunneling through the Schottky barrier to the CNT channel, as is represented in FIG. 2A and further being collected by the terminal (i.e. injected by tunneling to the channel from source and being collected by the drain that holds a negative bias as shown in FIG. 2A). Alternatively, as the gate voltage goes toward positive voltages (more than half of supply voltage and applied drain bias to the transistor), the energy bands are bent and shifted (relative to the drain/source Fermi levels) enabling electrons to conduct through by tunneling to the CNT channel, as is represented in FIG. 2B.

FIG. 2C shows $I_D/V_{GS}$, curves for exemplary nanotubes having diameters of 0.6, 1.0, and 1.5 nm. As is shown in the curves, a channel conducts minimal current when its gate-source voltage is at a "flatband" level (around VDD/2 for the curves in this example). If $V_{GS}$ is above this level, electrons conduct, with the electron current increasing as $V_{GS}$ increases. On the other hand, if VGS is below this minimal-current level, then holes conduct instead of electrons, with the hole current increasing as $V_{GS}$ decreases. A minimal current point is achieved when hole and electron currents balance each other out.

As indicated by these curves, channel current is affected by the diameter of the fabricated nanotube. As the diameter increases, the difference between minimum and maximum channel current ($I_D$) for a given drain/source voltage decreases. In most digital applications, a sufficient difference between on and off currents is desired, so a small CNT diameter may be sought. On the other hand, if the diameter is too small, the "ON" or charging current of the transistor reduces, which is not desirable. For example, one might have low "OFF" current and a good ON-to-OFF current ratio, but may not have a high enough "ON" current for desired digital applications. Accordingly, a suitable compromise between these competing factors may be sought. In some embodiments, a CNT with a diameter of between 0.5 and 2.0 nm may be suitable for implementation in digital circuits. In an example discussed below, a diameter of about 1 nm is used.

Figure 3:
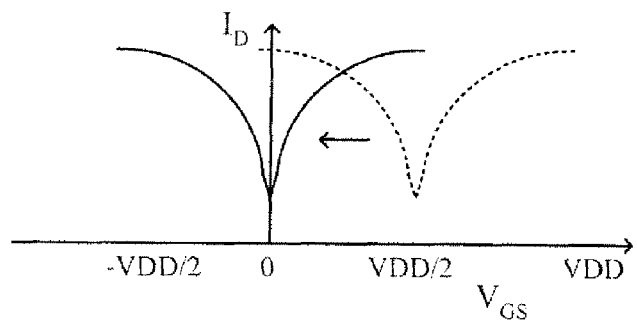
FIG. 3 is a diagram showing conduction characteristics of a mid-gap Schottky Barrier CNTFET with its flat band $V_{GS}$ shifted in accordance with some embodiments.

FIG. 3 shows an $I_D/V_{GS}$ curve for an ambipolar SB CNT whose flatband voltage has been shifted resulting in a shift of its $I_D/V_{GS}$ curve along the $V_{GS}$ axis so that its minimum current conduction occurs at VGS=0 V. In some embodiments, this may be achieved by applying a negative bias to the low supply side of the CNT transistor. With a flat band $V_{GS}$ of 0, the CNT can be better used as a digital device with a Low input voltage of 0 V and a High at VDD (or thereabouts for maximum voltage swing in circuit operation). In other embodiments, one could change the choice of gate electrode material, for example, using Pd (Palladium) or Al (Aluminum) to engineer a desired work function and provide a suitable shift in the transistor $I_D/V_{GS}$ curve, as shown in FIG. 3.

Figure 4:
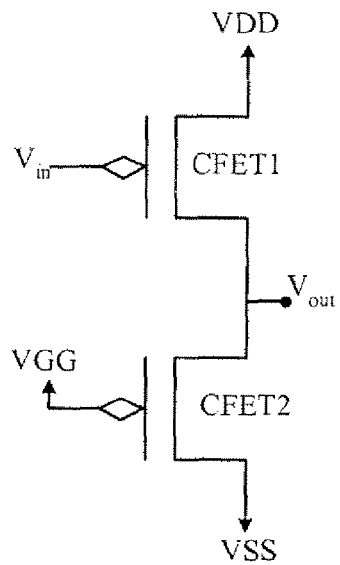
FIG. 4 is a schematic diagram of an inverter using Schottky Barrier CNTFETs in accordance with some embodiments.

FIG. 4 shows an exemplary logic gate (inverter) comprising first and second CNTFETs (CFET1, CFET2). They are coupled in series between a high supply voltage (VDD) and a low supply reference (VSS). (Note that they have a diamond at their gates to indicate that they are not necessarily physically configured, e.g., doped, to function as N-type or P-type devices, so the transistors themselves can function as N or P type devices depending on how they are biased.) The first CNTFET (CFET1), which is biased to conduct holes, functions as a driver transistor with its gate providing an inverter input ($V_{in}$). The second transistor (CFET2), which is biased to conduct electrons, functions to facilitate an active load with its gate coupled to a supply (VGG) for appropriately biasing it so that the output ($V_{out}$) provides suitable High and Low output values when $V_{in}$ is Low and High, respectively. Note that one can adjust $V_{GG}$ and $V_{SS}$ to achieve desired output swing. For example, it is commonly desirable for $V_{GG}$ to approach (if not equal $V_{DD}$ and for $V_{SS}$ to be at ground, but these voltages would depend on the behavior of a given CNTFET.

Figure 7:
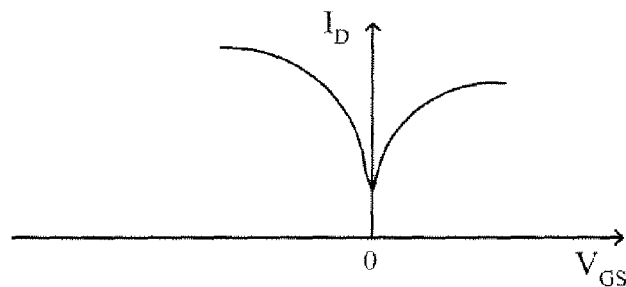
FIG. 7 is a diagram showing conduction characteristics of a Schottky Barrier CNTFET configured to conduct holes more strongly than electrons in accordance with some embodiments.

In accordance with some embodiments, the gate/source flatband levels for the CNTFETs (CFET1, CFET2) are shifted to the left by using a negative, low side supply (VSS) relative to a logical Low level of about 0 V and a logical High value of $V_{DD}$ (e.g., about 1.0 V). Moreover, the $I_D/V_{GS}$ characteristics of the transistors are made to be similar to that shown in FIG. 7. This figure shows a desired P type transistor behavior. In this case, hole current is enhanced over electron current in an ambipolar CNTFET.

Figure 8:
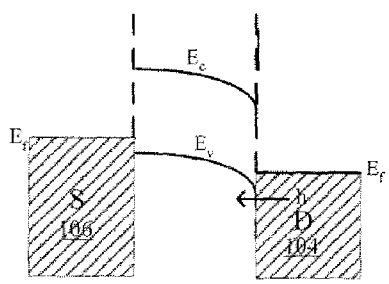
FIG. 8 is an energy band diagram for a band-edged Schottky Barrier CNTFET with source and drain terminals favoring hole conduction in accordance with some embodiments.

This can be achieved in several ways. It may be achieved by changing the work function of the source/drain material and hence the Schottky barrier, as illustrated in FIG. 8. For example, Pd (Palladium) could be used to favor hole conduction. Another way is to implement differently sized transistors (using different numbers of carbon nanotubes in each transistor's channel). For example, with the circuit of FIG. 4, CFET 1 could have a higher number of tubes than CFET 2 and hence be stronger than CFET2. It should be appreciated, however, that when packing multiple nanotubes in a single channel, a trade-off exists between the number of nanotubes per unit width and the capacitance (and current) per nanotube.

Figure 5:
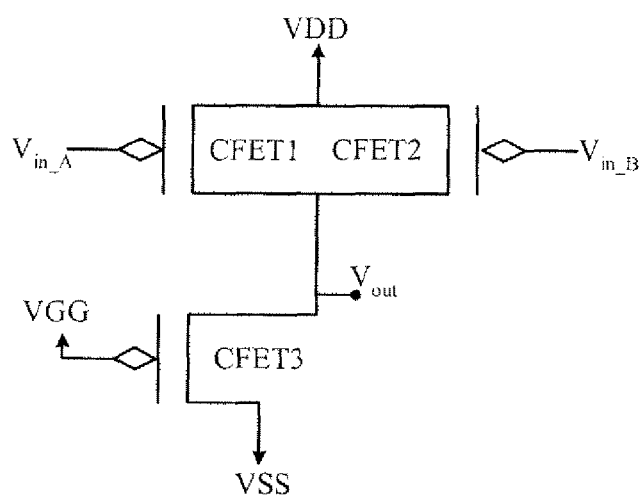
FIG. 5 is a schematic diagram of a NAND gate using Schottky Barrier CNTFETs in accordance with some embodiments.

FIG. 5 shows an exemplary NAND gate comprising CNTFETs as discussed herein in accordance with some embodiments. It comprises driver CNTFETs (CFET1, CFET2) coupled together in parallel between a high supply reference (VDD) and an active load transistor CFET3, which is coupled to a low supply reference VSS, as shown. The gates of the drive transistors (CFET1, CFET2) provide first and second NAND gate inputs ($V_{in\_A}$, $V_{in\_B}$) respectively, and a gate output is provided at the drain of CFET3 as shown. If either input is Low (e.g., 0 V), then the output is High (approaching VDD. Conversely, if both inputs are High (approaching VDD), then the output will be Low.

Figure 6:
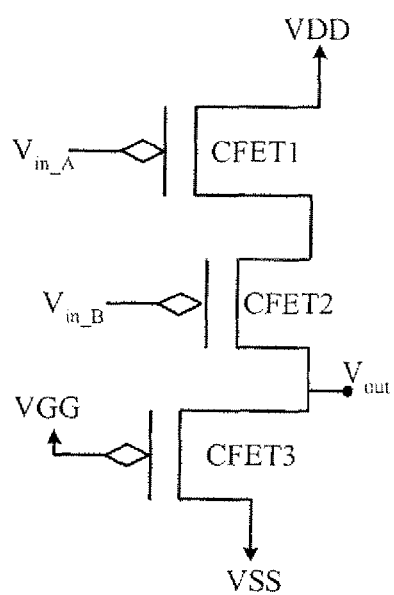
FIG. 6 is a schematic diagram of a NOR gate using Schottky Barrier CNTFETs in accordance with some embodiments.

FIG. 6 shows an exemplary NOR gate comprising CNTFETs as discussed herein in accordance with some embodiments. It comprises driver CNTFETs (CFET1, CFET2) coupled together in series between a high supply reference (VDD) and an active load transistor CFET3, which is coupled to a low supply reference VSS, as shown. The gates of the drive transistors (CFET1, CFET2) provide first and second NOR gate inputs ($V_{in\_A}$, $V_{in\_B}$) respectively, and a gate output is provided at the drain of CFET3 as shown. If both inputs are Low (e.g., 0 V), then the output is High (approaching VDD. Conversely, if either or both inputs are High (approaching VDD), then the output will be Low.

Other types of digital devices such as gates, memory devices, clocked logic, and the like could be implemented using CNTFETs as described herein. For example, persons of skill will appreciate that inverters, NOR and NAND gates can be building blocks for many types of more complex circuits. Along these lines, some integrated circuits could comprise both MOSFETs and CNTFETs, in separate circuit blocks or combined in hybrid circuits. For example, currently, in many CMOS applications, P type devices can limit the performance of circuits because they conduct more slowly (slower mobility) than their NMOS counterparts. Accordingly, circuits could use, for example, CNTFETs configure to conduct holes to function as P type devices, and NMOS devices (in Silicon or in other compound semiconductors such as III-V or II-VI materials) could be used for the N-type transistors.

Figure 9:
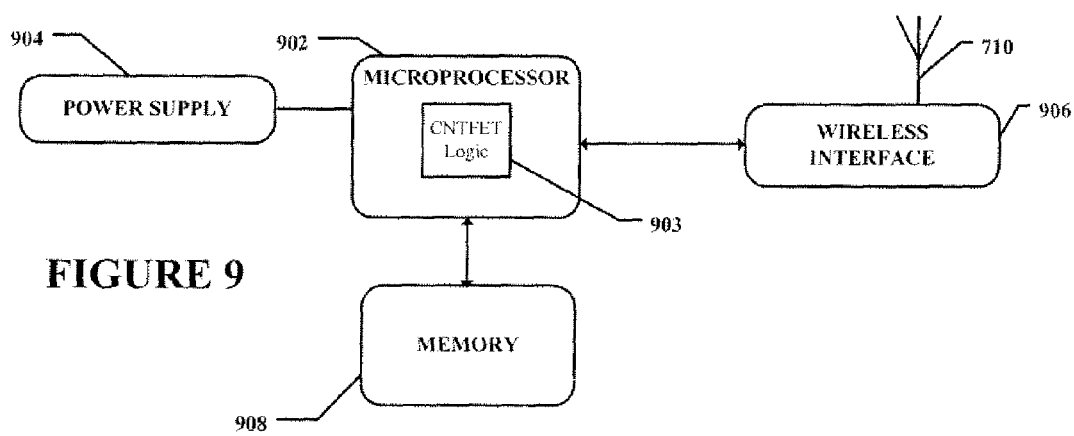
FIG. 9 is a block diagram of a computer system having a microprocessor with one or more logic circuits using CNTFET devices in accordance with some embodiments.

With reference to FIG. 9, one example of a computer system is shown. The depicted system generally comprises a processor 902 that is coupled to a power supply 904, a wireless interface 906, and memory 908. It is coupled to the power supply 904 to receive from it power when in operation. The wireless interface 906 is coupled to an antenna 910 to communicatively link the processor through the wireless interface chip 906 to a wireless network (not shown). Microprocessor 902 comprises one or more logic circuits 903 using CNTFET inverters, as disclosed herein.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An integrated circuit, comprising:
   first and second CNTFETs coupled in series between high and low supply references, the first CNTFET having a top gate to provide a logical input to receive High and Low logical values, the second CNTFET having a top gate coupled to a bias supply so that the second CNTFET provides an active load for the first CNTFET to provide suitable logical High and Low output levels.

2. The integrated circuit of claim 1, in which the level of the low supply reference is below a logical Low level.

3. The integrated circuit of claim 2, in which the first and second CNTFETs constitute an inverter gate.

4. The integrated circuit of claim 3, in which the first and second CNTFETs conduct holes stronger than electrons.

5. The integrated circuit of claim 4, in which the first CNTFET is biased to conduct holes, and the second CNTFET is biased to conduct electrons, wherein the first CNTFET is stronger than the second CNTFET.

6. The integrated circuit of claim 5, in which the first and second CNTFETs comprise drain and source electrodes formed from a material with a Fermi energy level that is closer to a valence band than to a conduction band.

7. The integrated circuit of claim 5, in which the first and second CNTFET have channels comprising one or more carbon nanotubes, the first CNTFET channel having more carbon nanotubes than the second CNTFET channel so that the first CNTFET conducts more strongly than the second CNTFET.

8. The integrated circuit of claim 1, in which the first and second CNTFETs have channels formed from intrinsic carbon nanotubes.

9. An inverter circuit, comprising:
   a first CNTFET coupled between a first supply reference and an output node for the inverter circuit; and
   a second CNTFET coupled between the output node and a second supply reference, the first CNTFET to provide an input to receive High and Low logical values for the inverter circuit, the second CNTFET biased to provide an active load for the first CNTFET, wherein the second CNTFET is turned on for High and Low output states.

10. The inverter circuit of claim 9, in which the first supply reference is greater than the second supply reference.

11. The inverter circuit of claim 10, in which the first and second CNTFETs conduct holes stronger than electrons.

12. The inverter circuit of claim 11, in which the first CNTFET is biased to conduct holes, and the second CNTFET is biased to conduct electrons, wherein the first CNTFET is stronger than the second CNTFET.

13. The inverter circuit of claim 12, in which the first and second CNTFETs comprise drain and source electrodes formed from a material with a Fermi energy level that is closer to a valence band than to a conduction band.

14. The inverter circuit of claim 13, in which the first and second CNTFET have channels comprising one or more carbon nanotubes, the first CNTFET channel having more carbon nanotubes than the second CNTFET channel so that the first CNTFET conducts more strongly than the second CNTFET.

15. The inverter circuit of claim 9, in which the first and second CNTFETs have channels formed from intrinsic carbon nanotubes.

* * * * *

UNITED STATES PATENT AND TRADEMARK OFFICE
CERTIFICATE OF CORRECTION

PATENT NO. : 8,004,043 B2  Page 1 of 1
APPLICATION NO. : 11/613134
DATED : August 23, 2011
INVENTOR(S) : Keshavarzi et al.

It is certified that error appears in the above-identified patent and that said Letters Patent is hereby corrected as shown below:

On the Title Page, in item (75), under Inventors, at line 2, delete "Juanita Kurtlin, Hillsboro, OR (US)", and insert --Juanita Kurtin, Hillsboro, OR (US)--.

Signed and Sealed this
Second Day of July, 2013

Teresa Stanek Rea
*Acting Director of the United States Patent and Trademark Office*